(12) United States Patent
Inada et al.

(10) Patent No.: US 12,119,417 B2
(45) Date of Patent: Oct. 15, 2024

(54) OPTICAL SEMICONDUCTOR ELEMENT, OPTICAL SEMICONDUCTOR DEVICE, OPTICAL TRANSMISSION SYSTEM, AND METHOD OF MANUFACTURING OPTICAL SEMICONDUCTOR DEVICE

(71) Applicant: FUJIFILM Business Innovation Corp., Tokyo (JP)

(72) Inventors: Satoshi Inada, Ebina (JP); Kenichi Ono, Ebina (JP); Takeshi Minamiru, Ebina (JP); Akemi Murakami, Ebina (JP); Junichiro Hayakawa, Ebina (JP); Tsutomu Otsuka, Yokohama (JP)

(73) Assignee: FUJIFILM BUSINESS INNOVATION CORP., Tokyo (JP)

( * ) Notice: Subject to any disclaimer, the term of this patent is extended or adjusted under 35 U.S.C. 154(b) by 651 days.

(21) Appl. No.: 17/335,201

(22) Filed: Jun. 1, 2021

(65) Prior Publication Data
US 2021/0288193 A1    Sep. 16, 2021

Related U.S. Application Data

(63) Continuation of application No. PCT/JP2019/047233, filed on Dec. 3, 2019.

(30) Foreign Application Priority Data

Feb. 7, 2019  (JP) ................................ 2019-021032

(51) Int. Cl.
*H01S 5/042* (2006.01)
*H01L 31/0224* (2006.01)
(Continued)

(52) U.S. Cl.
CPC ...... *H01L 31/022408* (2013.01); *H01L 31/18* (2013.01); *H01S 5/0208* (2013.01);
(Continued)

(58) Field of Classification Search
CPC ....... H01S 5/0208; H01S 5/0425; H01S 5/183
See application file for complete search history.

(56) References Cited

U.S. PATENT DOCUMENTS

| | | | |
|---|---|---|---|
| 2005/0025207 A1* | 2/2005 | Thornton | ................. G11B 7/22 |
| | | | 372/50.1 |
| 2005/0094695 A1* | 5/2005 | Trezza | ................ H01S 5/18305 |
| | | | 372/50.1 |

(Continued)

FOREIGN PATENT DOCUMENTS

| | | |
|---|---|---|
| CN | 1716720 A | 1/2006 |
| CN | 1812075 A | 8/2006 |

(Continued)

OTHER PUBLICATIONS

Feb. 18, 2020 Search Report issued in International Patent Application No. PCT/JP2019/047233.

(Continued)

*Primary Examiner* — Yuanda Zhang
(74) *Attorney, Agent, or Firm* — Oliff PLC

(57) ABSTRACT

An optical semiconductor element includes: a semiconductor substrate that is semi-insulating; a columnar body that is formed on a front surface-side of the semiconductor substrate and configured to emit or receive light from the front surface-side; a front surface-side electrode that is connected to the columnar body; a back surface-side electrode formed on a back surface-side of the semiconductor substrate; and an electrically conductive member that is formed to penetrate through the semiconductor substrate to connect the front surface-electrode and the back surface-side electrode, and has a protruding portion protruding on the front surface-side of the semiconductor substrate.

9 Claims, 6 Drawing Sheets

(51) Int. Cl.
    *H01L 31/18*     (2006.01)
    *H01S 5/02*     (2006.01)
    *H01S 5/0239*     (2021.01)
    *H01S 5/183*     (2006.01)

(52) U.S. Cl.
    CPC .......... *H01S 5/0239* (2021.01); *H01S 5/0425* (2013.01); *H01S 5/183* (2013.01)

(56) References Cited

U.S. PATENT DOCUMENTS

| | | |
|---|---|---|
| 2005/0286596 A1 | 12/2005 | Mukoyama et al. |
| 2005/0286597 A1 | 12/2005 | Mukoyama et al. |
| 2006/0138629 A1 | 6/2006 | Fukazawa |
| 2009/0323746 A1 | 12/2009 | Ohmi et al. |
| 2010/0276787 A1 | 11/2010 | Yu et al. |
| 2011/0193123 A1 | 8/2011 | Moon et al. |
| 2020/0274321 A1* | 8/2020 | Ghegin ................... H01S 5/021 |
| 2021/0175686 A1* | 6/2021 | Iwahama .............. G01S 17/894 |

FOREIGN PATENT DOCUMENTS

| | | |
|---|---|---|
| CN | 101877336 A | 11/2010 |
| CN | 107093840 A | 8/2017 |
| JP | 2001-308109 A | 11/2001 |
| JP | 2007-059673 A | 3/2007 |
| JP | 2007-287849 A | 11/2007 |
| JP | 2010-219342 A | 9/2010 |
| JP | 2011-166150 A | 8/2011 |
| JP | 2012-119428 A | 6/2012 |

OTHER PUBLICATIONS

Feb. 18, 2020 Written Opinion issued in International Patent Application No. PCT/JP2019/047233.
Aug. 1, 2023 Office Action issued in Japanese Patent Application No. 2019-021032.
Feb. 28, 2023 Office Action issued in Japanese Patent Application No. 2019-021032.
Jan. 25, 2024 Office Action issued in Chinese Patent Application No. 201980088132.5.
"Introduction to Micromechanics", Wang Qimin, p. 39-47, University of Science and Technology of China Press, Mar. 31, 2023.

* cited by examiner

OPTICAL SEMICONDUCTOR ELEMENT, OPTICAL SEMICONDUCTOR DEVICE, OPTICAL TRANSMISSION SYSTEM, AND METHOD OF MANUFACTURING OPTICAL SEMICONDUCTOR DEVICE

CROSS REFERENCE TO RELATED APPLICATION

This is a continuation of International Application No. PCT/JP2019/047233 filed on Dec. 3, 2019, and claims priority from Japanese Patent Application No. 2019-21032 filed on Feb. 7, 2019.

BACKGROUND

Technical Field

The present invention relates to an optical semiconductor element, an optical semiconductor device, an optical transmission system, and a method of manufacturing an optical semiconductor device.

Related Art

JP-A-2007-059673 discloses a semiconductor laser device including a surface-emitting semiconductor laser element having a mesa structure on a substrate, wherein at least one protruding portion for electrostatic breakdown prevention is provided on the substrate, and the at least one protruding portion has an electrically conductive path connected to a reference potential and is arranged around the surface-emitting semiconductor laser element.

SUMMARY

Aspects of non-limiting embodiments of the present disclosure relate to an optical semiconductor element configured to emit or receive light from a surface, an optical semiconductor device, an optical transmission system, and a method of manufacturing an optical semiconductor device capable of protecting a surface while reducing a parasitic element when connected to an outside.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an optical semiconductor element including: a semiconductor substrate that is semi-insulating; a columnar body that is formed on a front surface-side of the semiconductor substrate and configured to emit or receive light from the front surface-side; a front surface-side electrode that is connected to the columnar body; a back surface-side electrode formed on a back surface-side of the semiconductor substrate; and an electrically conductive member that is formed to penetrate through the semiconductor substrate to connect the front surface-electrode and the back surface-side electrode, and has a protruding portion protruding on the front surface-side of the semiconductor substrate.

BRIEF DESCRIPTION OF DRAWINGS

Exemplary embodiment(s) of the present invention will be described in detail based on the following figures, wherein.

DETAILED DESCRIPTION

Hereinafter, exemplary embodiments will be described in detail with reference to the drawings. Note that, in descriptions below, a surface-emitting semiconductor laser (VCSEL: Vertical Cavity Surface Emitting Laser) is exemplified as the optical semiconductor element.

First Exemplary Embodiment

An optical semiconductor element and a method of manufacturing the optical semiconductor element according to the present exemplary embodiment are described with reference to FIGS. 1 to 4.

Figure 1:
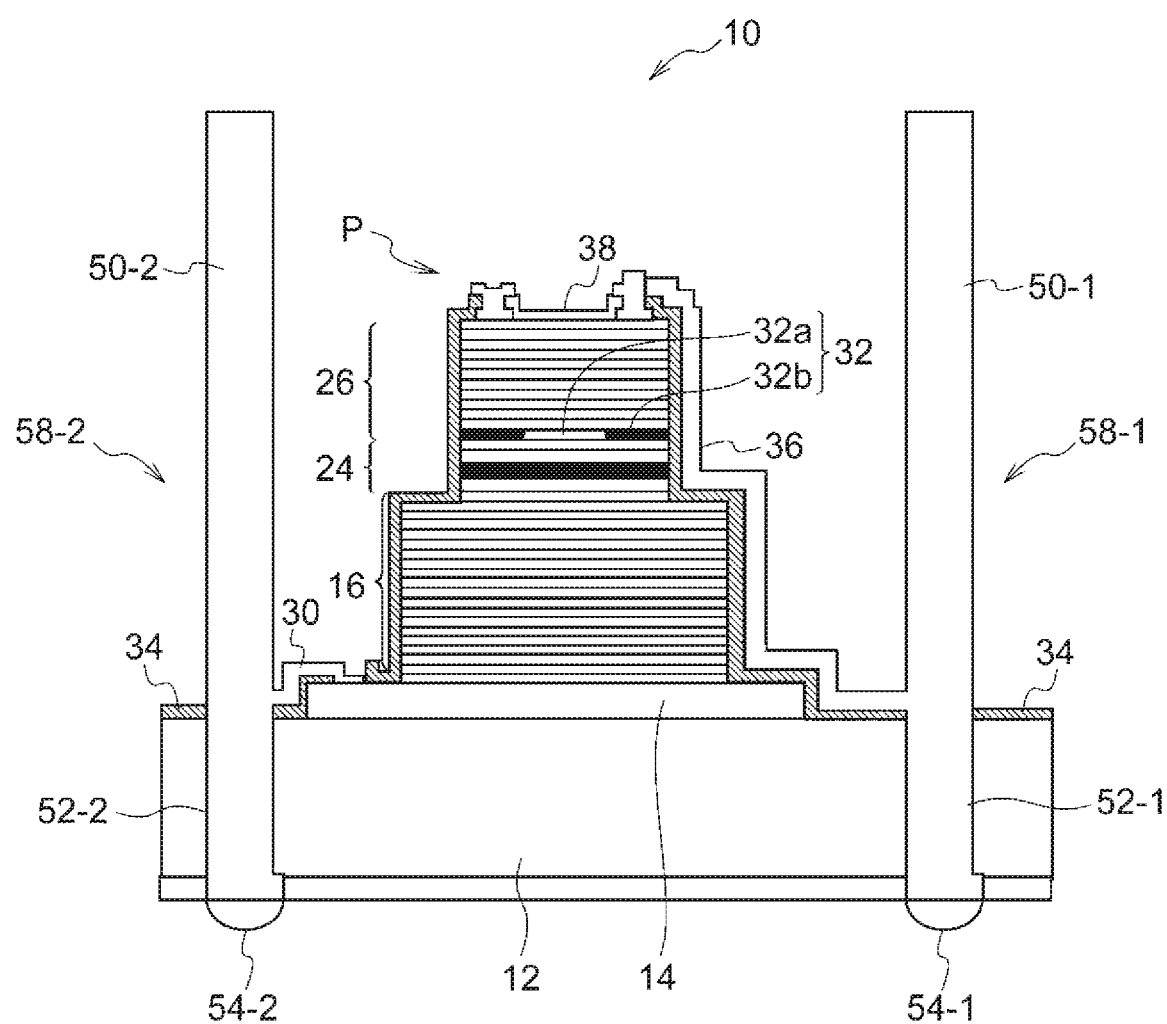
FIG. 1 is a sectional view showing an example of a configuration of an optical semiconductor element according to a first exemplary embodiment.

An example of a configuration of an optical semiconductor element 10 according to the present exemplary embodiment is described with reference to FIG. 1. As shown in FIG. 1, the optical semiconductor element 10 includes an n-type GaAs contact layer 14 formed on a semi-insulating GaAs (gallium arsenide) substrate 12, a lower DBR (Distributed Bragg Reflector) 16, an active region 24, an oxidized constriction layer 32, and an upper DBR 26. In the optical semiconductor element 10, each configuration of the contact layer 14, the lower DBR 16, the active region 24, the oxidized constriction layer 32, and the upper DBR 26 forms a columnar body (hereinafter, the "post P"), and the post P constitutes a laser part.

An interlayer dielectric film 34 as an inorganic insulating film is formed around the semiconductor layer including the post P. The interlayer dielectric film 34 extends from a side surface of the post P to a front surface of the substrate 12. The interlayer dielectric film 34 of the present exemplary embodiment is formed by a silicon nitride film (SiN film), for example. The material of the interlayer dielectric film 34 is not limited to the silicon nitride film, and may be, for example, a silicon oxide film (SiO$_2$ film), a silicon oxynitride film (SiON film) or the like.

As shown in FIG. 1, a p-side electrode wiring 36 is provided on the interlayer dielectric film 34. One end-side of the p-side electrode wiring 36 is connected to a contact layer (not shown) formed on a top layer of the upper DBR 26, and forms ohmic contact with the contact layer. On the other hand, the other end-side of the p-side electrode wiring 36 extends from the side surface of the post P to the front surface of the substrate 12, and constitutes an electrode pad (not shown). The p-side electrode wiring 36 is formed by a laminated film of Ti (titanium)/Au (gold), for example. As shown in FIG. 1, in the present exemplary embodiment, the p-side electrode wiring 36 is connected to a protruding portion 50-1, which will be described later.

Similarly, an n-side electrode wiring 30 is provided via an opening of the interlayer dielectric film 34. One end-side of the n-side electrode wiring 30 is connected to the contact layer 14, and forms ohmic contact with the contact layer 14. On the other hand, the other end-side of the n-side electrode wiring 30 extends to the front surface of the substrate 12, and forms an electrode pad (not shown). The n-side electrode wiring 30 is formed by depositing a laminated film of AuGe/Ni/Au, for example. As shown in FIG. 1, in the present exemplary embodiment, the n-side electrode wiring 30 is connected to a protruding portion 50-2, which will be described later.

The contact layer 14 formed on the substrate 12 is formed by a GaAs layer in which Si is doped, for example. One end of the contact layer 14 is connected to the n-type lower DBR 16, and the other end is connected to the n-side electrode wiring 30. Specifically, the contact layer 14 is interposed between the lower DBR 16 and the n-side electrode wiring 30, and functions to apply a negative potential to the laser part constituted by the post P.

The n-type lower DBR 16 formed on the contact layer 14 is a multilayer reflecting mirror where two semiconductor layers having different refractive indexes are repeatedly laminated in an alternate manner. When an oscillation wavelength of the optical semiconductor element 10 is denoted as $\lambda$ and a refractive index of the medium (semiconductor layer) is denoted as n, the two semiconductor layers each have a film thickness of 0.25 $\lambda/n$. Specifically, the lower DBR 16 is constituted by repeatedly laminating an n-type low refractive index layer of $Al_{0.90}Ga_{0.1}As$ and an n-type high refractive index layer of $Al_{0.15}Ga_{0.85}As$ in an alternate manner.

The active region 24 of the present exemplary embodiment may be constituted to include a lower spacer layer, a quantum well active layer, and an upper spacer layer (not shown), for example. The quantum well active layer of the present exemplary embodiment may be constituted by four barrier layers of $Al_{0.3}Ga_{0.7}As$, and three quantum well layers of GaAs provided between the barrier layers. Note that, the lower spacer layer and the upper spacer layer are each arranged between the quantum well active layer and the lower DBR 16 and between the quantum well active layer and the upper DBR 26. Thereby, the lower spacer layer and the upper spacer layer have a function of adjusting a length of an oscillator and a function as a clad layer for confining carriers.

The p-type oxidized constriction layer 32 formed on the active region 24 is a current constriction layer, and includes an unoxidized region 32a and an oxidized region 32b. The current that flows from the p-side electrode wiring 36 toward the n-side electrode wiring 30 is restricted by the unoxidized region 32a.

The upper DBR 26 formed on the oxidized constriction layer 32 is a multilayer reflecting mirror constituted by repeatedly laminating two semiconductor layers having a film thickness of 0.25 $\lambda/n$ and different refractive indexes in an alternate manner. Specifically, the upper DBR 26 is constituted by repeatedly laminating a p-type low refractive index layer of $Al_{0.90}Ga_{0.1}As$ and a p-type high refractive index layer of $Al_{0.15}Ga_{0.85}As$ in an alternate manner.

In the present exemplary embodiment, as described above, the contact layer (not shown) is provided on the top layer of the upper DBR 26, and an exit surface protecting layer 38 for protecting an exit surface of light is provided on the contact layer. The exit surface protecting layer 38 is formed of a silicon nitride film, for example.

As shown in FIG. 1, the optical semiconductor element 10 further has vias 52-1 and 52-2 (hereinafter, which may also be collectively referred as "via 52"), and bumps 54-1 and 54-2 (hereinafter, which may also be collectively referred as "bump 54"). The bump 54 is used when flip chip-mounting the optical semiconductor element 10 on a printed substrate and the like, for example. The vias 52-1 and 52-2 are each connected to the protruding portions 50-1 and 50-2 (hereinafter, which may also be collectively referred as "protruding portion 50"). As described later, the protruding portion 50 has a function as an alignment mark, a function of protecting an element surface during manufacturing (a function of preventing a contact damage), and the like. A height of the protruding portion 50 from a front surface of the optical semiconductor element 10 is set to exceed at least a height of the p-side electrode wiring or the n-side electrode wiring, considering protection of electrodes on the front surface.

The via 52 and the protruding portion 50 are integrally formed by metal, for example, and there is no clear boundary line therebetween. In the below, for convenience, a metal portion formed from a front surface to a back surface of the substrate 12 is referred to as the via 52, and a metal portion protruding from the front surface of the substrate 12 is referred to as the protruding portion 50. A metal portion consisting of the via 52-1 and the protruding portion 50-1 is an electrically conductive member 58-1, and a metal portion consisting of the via 52-2 and the protruding portion 50-2 is an electrically conductive member 58-2 (hereinafter, which may also be collectively referred as "electrically conductive member 58)".

Here, a light-emitting element according to the related technology usually adopt surface emission when a wavelength band of emitted light is a wavelength band that is absorbed by a substrate. In this case, as for a surface electrode, the light-emitting element and an outside (a printed substrate and the like) are connected to each other by wire bonding. In addition, when it is intended to drive the light-emitting element at high speed, the substrate is formed with through-electrodes and bumps are provided on a back surface for connection, so as to reduce parasitic elements. However, in any method, there is no special scheme from a standpoint of protecting the front surface of the light-emitting element chip. In the optical semiconductor element 10 of the present exemplary embodiment, the substrate is provided with through-electrodes, which are connected to bumps on the back surface, and the front surface is provided with the protruding portions 50 continuing to (integrated with) the through-electrodes. Thereby, when the optical semiconductor element configured to emit light from an element surface is connected to the outside, the element surface is protected while reducing the parasitic element. In addition, as described later, the protruding portion of the present exemplary embodiment is automatically formed in a manufacturing method of the present exemplary embodiment. Further, in the optical semiconductor element according to the related technology, an opening is formed from a back surface of the element, and the opening is filled from a front surface thereof. In contrast, in the optical semiconductor element of the present exemplary embodiment, an opening is formed from the front surface and is filled from the front surface.

Subsequently, a method of manufacturing the optical semiconductor element 10 is described with reference to FIGS. 2A to 2H and FIGS. 3A to 3G. Note that, in descriptions below, it is assumed that the VCSEL including the post P is already formed on a substrate 70. Specifically, the post P is formed on the substrate 70, an insulating film 72 is further formed, and a wiring 74 is formed on the insulating film 72. The processes shown in FIGS. 2A to 2H and FIGS. 3A to 3G are usually performed in a wafer state where plural VCSEL elements are formed. However, the method is described using the drawings in which one optical semiconductor element 10 is shown.

Figure 2A:
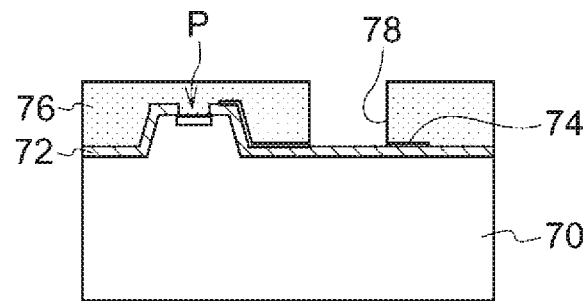
FIGS. 2A to 2H are parts of sectional views showing an example of a method of manufacturing the optical semiconductor element according to the first exemplary embodiment.

First, a front surface-side of the substrate 12 is formed with an opening 80 for forming the electrically conductive member 58 by using photolithography and etching. To this end, a resist 76 is applied on the front surface-side of the substrate 12, and an opening 78 is formed in a position of the resist 76 corresponding to the opening 80 (FIG. 2A).

Figure 4:
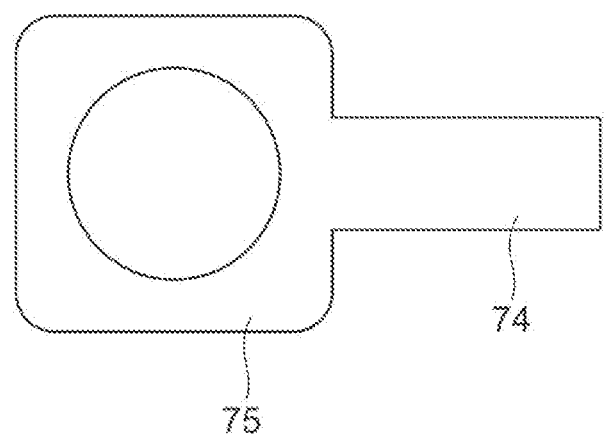
FIG. 4 is a plan view showing a wiring including an electrode pad of the optical semiconductor element according to the first exemplary embodiment.

Here, in the present exemplary embodiment, as shown in FIG. 4, an electrode pad 75 is formed in a position of the wiring 74 corresponding to the opening 80. The wiring 74 and the electrode pad 75 are formed of metal such as Au, for example. In the present exemplary embodiment, as shown in FIG. 4, the electrode pad 75 is formed to have a ring shape (closed shape) so that the wiring metal is less etched during the etching for forming the opening 80. This is for connection with the electrically conductive member 58 even though the position of the opening 80 on a plane of the substrate 12 is slightly misaligned, for example. Specifically, in the present exemplary embodiment, the electrode pad 75 has a ring shape, so that a level of tolerance of manufacturing positional alignment in wiring formation is improved, as compared to a linear wiring (in general, a wiring having an opened shape).

Figure 2B:
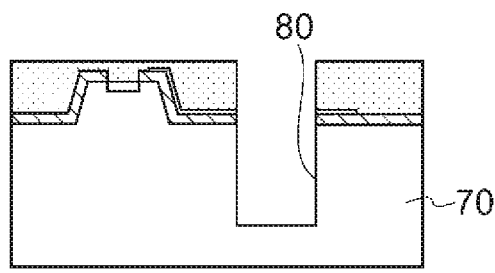

Then, the substrate 12 is formed with the opening 80 by etching via the opening 78 (FIG. 2B). At this time, the etching may be either dry etching or wet etching. However, in the present exemplary embodiment, dry etching is used.

Figure 2C:
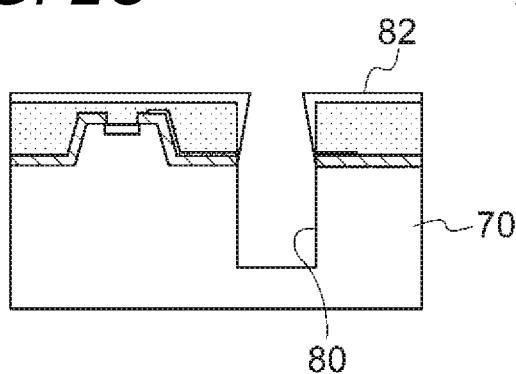

Then, a metal film 82 is formed using a sputter, for example (FIG. 2C). The metal film 82 is provided so as to improve electrical connectivity between the electrode pad 75 and an electrically conductive member 84, which will be described later. Note that, this process may be omitted as long as electrical connectivity is not particularly problematic.

Figure 2D:
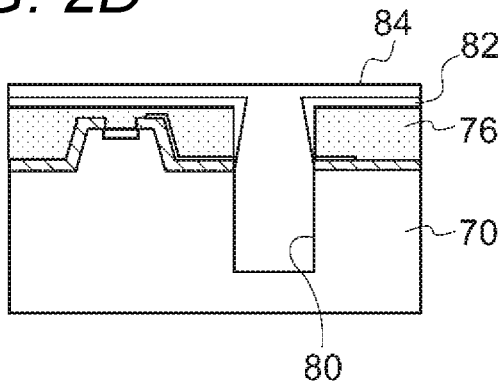

Then, the opening 80 is filled with an electrically conductive member 84 (FIG. 2D). A material and a shape of the electrically conductive member 84 are not particularly limited. For example, metal plating by copper, for example, vacuum printing by silver paste is performed. In the present exemplary embodiment, the electrically conductive member 84 is formed using silver paste, for example.

Figure 2E:
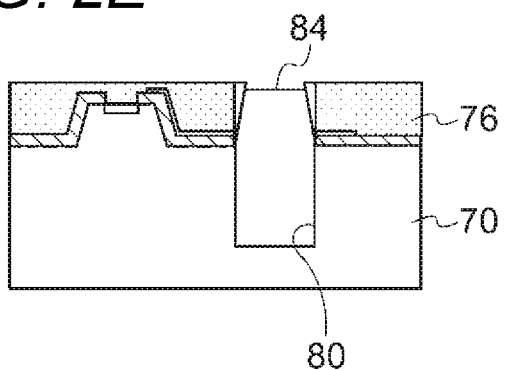

Then, the metal film 82 formed on the resist 76 and the electrically conductive member 84 are cut, and the electrically conductive member 84 in the opening 80 is caused to remain (FIG. 2E). The remaining electrically conductive member 84 constitutes the electrically conductive member 58 shown in FIG. 1. In the method of manufacturing the optical semiconductor element 10 according to the present exemplary embodiment, since the electrically conductive member 58 is formed during the manufacturing process, the exit surface of the post P and the like are protected in a back grinding process of subsequent processes and in handling between respective processes.

Figure 2F:
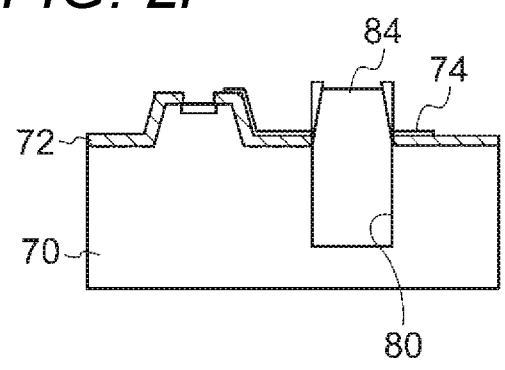

Then, the resist 76 is separated using reactive ion etching (RIE) or wet etching (FIG. 2F). At this time, a part of the resist 76 may remain. Note that, FIG. 2G and thereafter exemplify a case where the resist 76 remains.

Figure 2G:
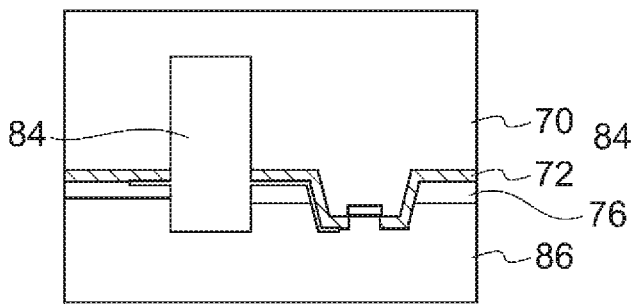

Then, a back grind tape 86 is bonded to the front surface-side of the substrate 12, for example (FIG. 2G; FIG. 2G is upside down with respect to FIG. 2F).

Figure 2H:
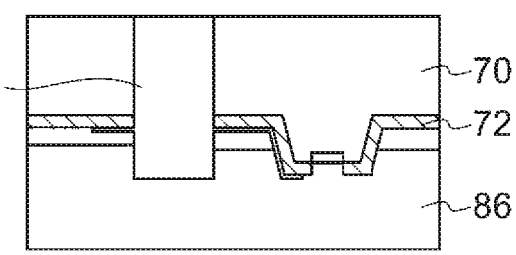

Then, a back surface of the substrate 12 is ground using CMP (Chemical Mechanical Polishing), for example, thereby exposing the electrically conductive member 84 (FIG. 2H). As shown in FIG. 2H, in the present exemplary embodiment, the electrically conductive member 84 (i.e., the via 52 shown in FIG. 1) is exposed by grinding the back surface of the substrate 12.

Figure 3A:
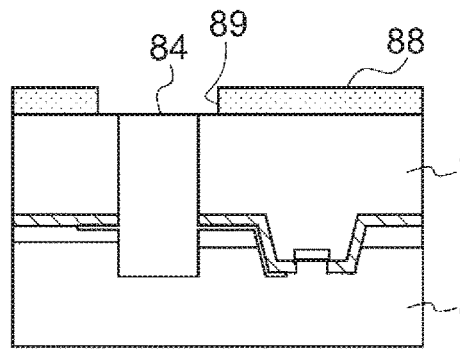
FIGS. 3A to 3G are parts of sectional views showing the example of the method of manufacturing the optical semiconductor element according to the first exemplary embodiment.
Figure 3B:
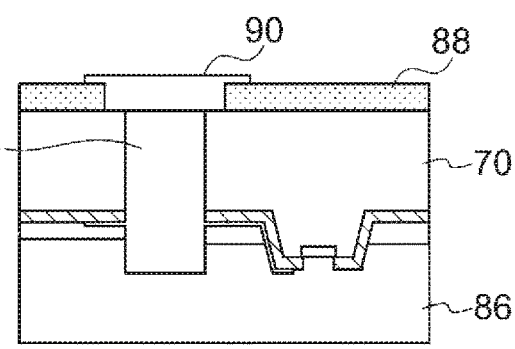

Then, a resist 88 is applied on an entire surface, and an opening 89 is formed in a position corresponding to the electrically conductive member 84 by using photolithography (FIG. 3A).

Figure 3C:
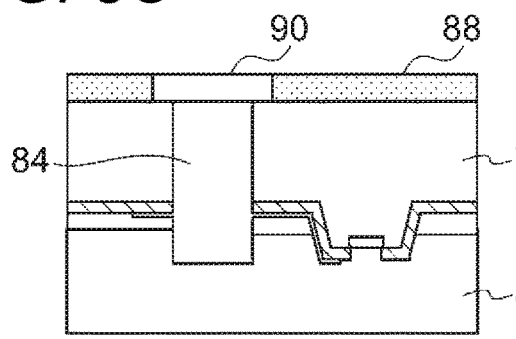
Figure 3D:
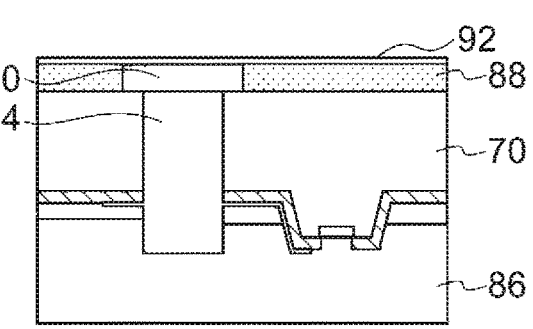

Then, a silver paste 90 is printed, for example (FIG. 3B), and then the paste 90 is cut to a position of the resist 88 (FIG. 3C).

Figure 3E:
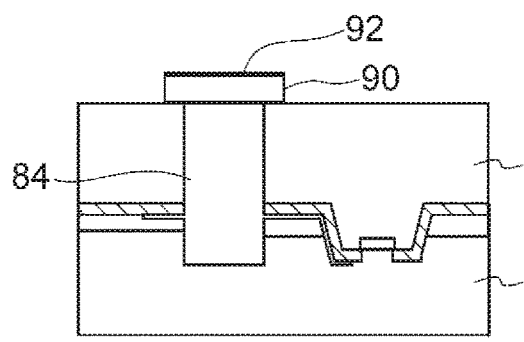
Figure 3F:
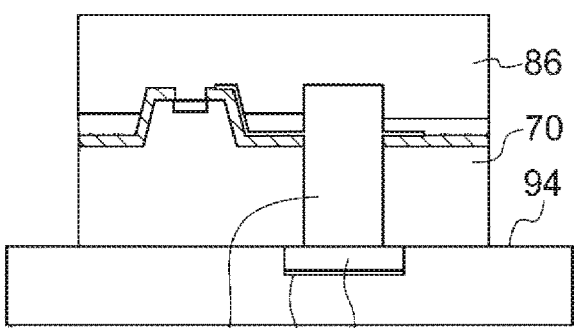

Then, a metal film 92 of Ni (nickel)/Au is formed, for example (FIG. 3D), and then, the resist 88 and the metal film 92 on the resist 88 are peeled off by liftoff (FIG. 3E).

Figure 3G:
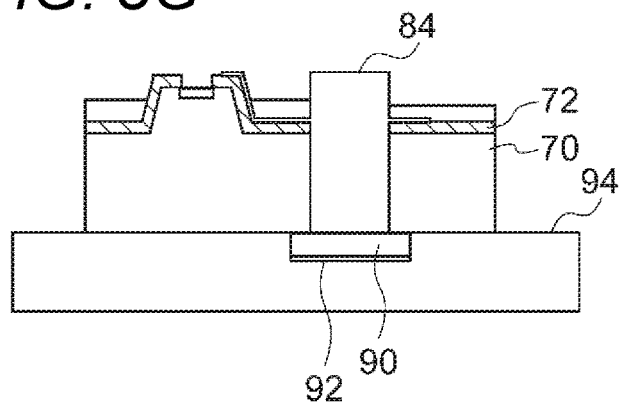

Then, a dicing tape 94 is bonded (FIG. 3F), and the back grind tape 86 is peeled off (FIG. 3G).

Then, the plural VCSELs in the wafer state are segmented into pieces, so that the optical semiconductor element 10 of the present exemplary embodiment is manufactured. The substrate 70, the insulating film 72, and the electrically conductive member 84 shown in FIG. 3G correspond to the substrate 12, the interlayer dielectric film 34, and the electrically conductive member 58 shown in FIG. 1. Here, the bump 54 shown in FIG. 1 is formed on the metal film 92, as necessary.

Subsequently, an application aspect of the optical semiconductor element 10 according to the present exemplary embodiment is described with reference to FIGS. 5A and 5B.

Figure 5A:
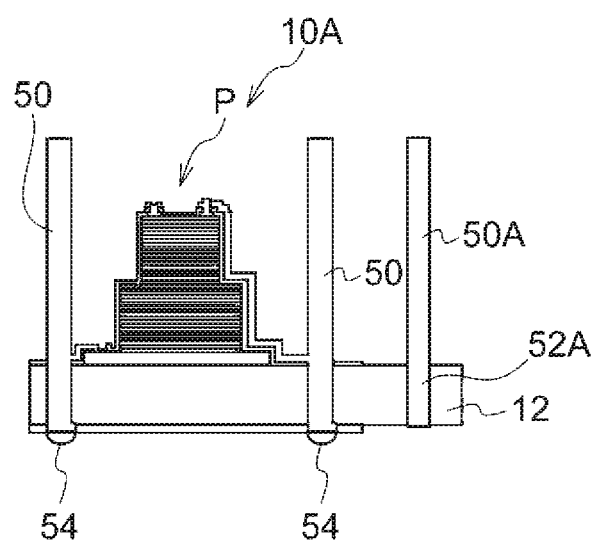
FIGS. 5A and 5B show application examples of the optical semiconductor element according to the first exemplary embodiment.

FIG. 5A shows an optical semiconductor element 10A where the protruding portion 50 is used as an alignment mark. As compared to the optical semiconductor element 10, the optical semiconductor element 10A further includes a protruding portion 50A. By using the protruding portion 50A as an alignment mark, alignment with a member connected to an outside of the optical semiconductor element 10A is performed, for example. Note that, in the example of FIG. 5A, the electrically conductive member penetrating through the substrate 12 is used by using a via 52A. However, the electrically conductive member is not necessarily required to penetrate through the substrate, and may end within the substrate 12. In this case, the opening 80 shown in FIG. 2B may be formed shallower.

Figure 5B:
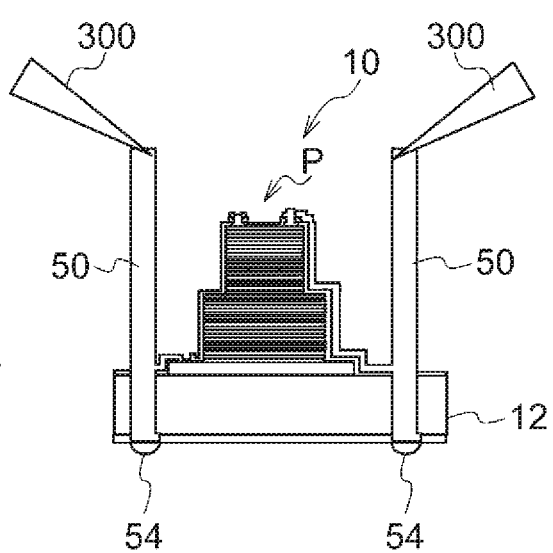

FIG. 5B shows an aspect where the optical semiconductor element 10 is inspected using the protruding portions 50. As shown in FIG. 1, in the optical semiconductor element 10 according to the present exemplary embodiment, the protruding portion 50 is connected to the p-side electrode wiring 36 or the n-side electrode wiring 30. Therefore, as shown in FIG. 5B, the inspection on the optical semiconductor element 10 is performed by bringing a probe 300 of a tester into contact with the protruding portion 50. Specifically, the inspection is performed from the front surface-side without using the bump 54. Note that, at this time, the optical semiconductor element 10 may be in a wafer state or in a state of being segmented into a piece.

Second Exemplary Embodiment

An optical semiconductor element 10B according to a second exemplary embodiment is described with reference to FIG. 6. The optical semiconductor element 10B has such a shape that a resist 56 is provided on the front surface of the optical semiconductor element 10. Therefore, the configurations that are similar to those of the optical semiconductor element 10 are denoted with the same reference signs, and the detailed descriptions thereof are omitted.

Figure 6:
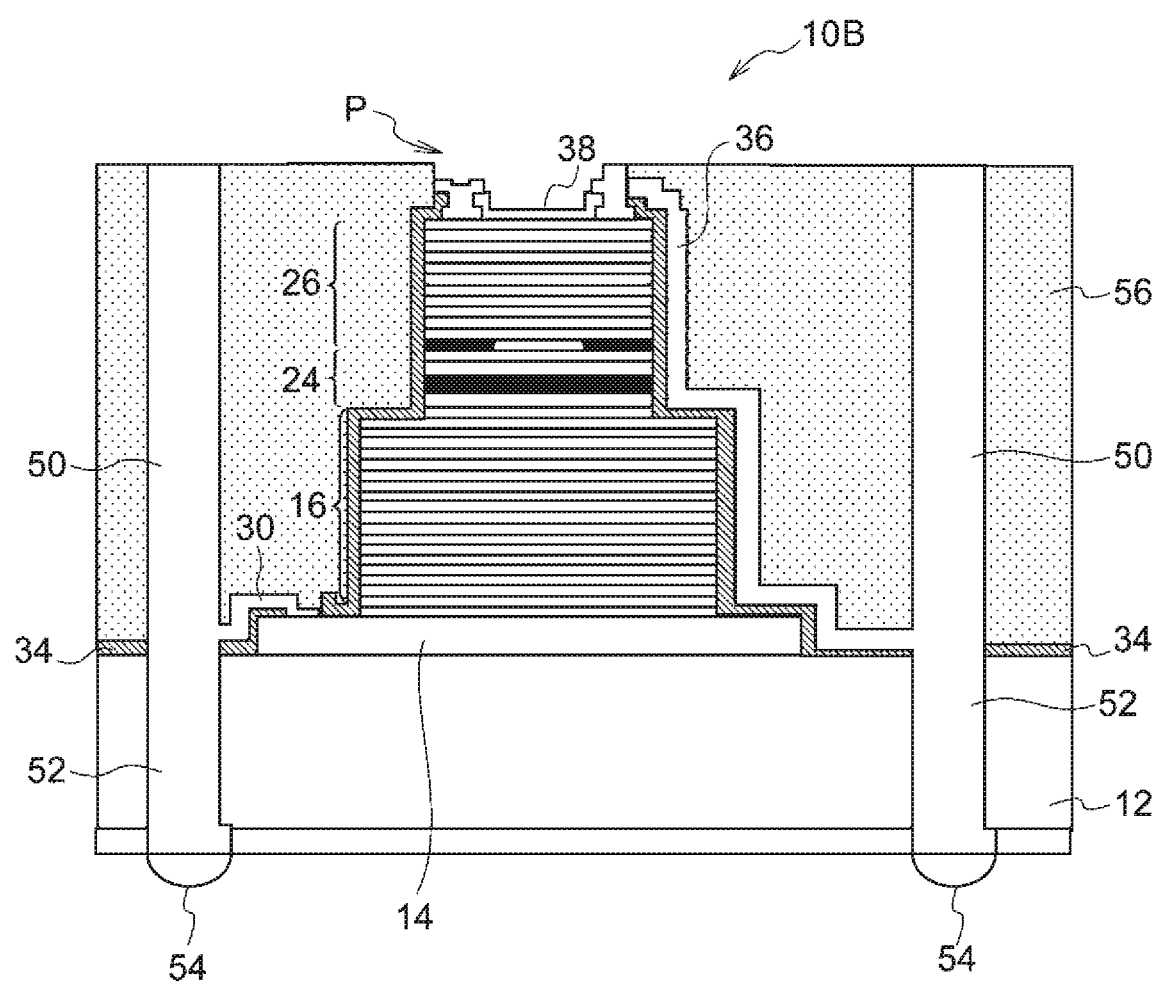
FIG. 6 is a sectional view showing an example of a configuration of an optical semiconductor element according to a second exemplary embodiment.

As shown in FIG. 6, in the optical semiconductor element 10B, parts except top portions of the protruding portions 50 are covered with the resist 56. For this reason, according to the optical semiconductor element 10B, when connected to the outside, the front surface is protected while reducing the parasitic element. Further, the highly reliable optical semiconductor element is provided.

Third Exemplary Embodiment

An optical semiconductor device and an optical transmission system according to a third exemplary embodiment are described with reference to FIGS. 7A and 7B.

Figure 7A:
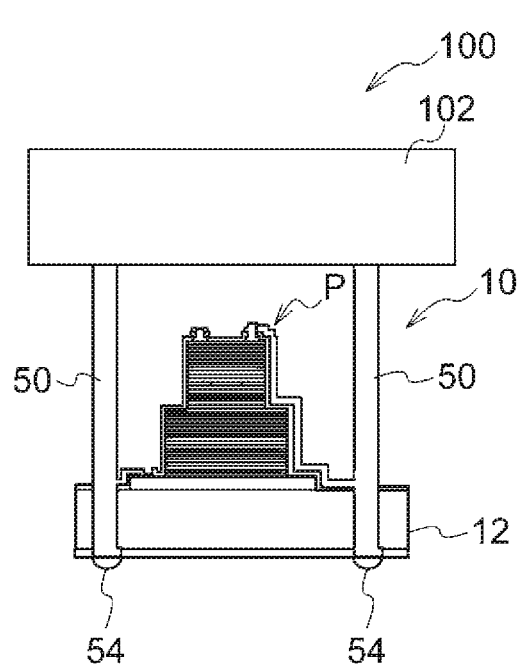
FIG. 7A is a sectional view showing an example of a configuration of an optical semiconductor device according to a third exemplary embodiment.

As shown in FIG. 7A, an optical semiconductor device 100 according to the present exemplary embodiment includes the optical semiconductor element 10 and a light diffusion plate 102. The light diffusion plate 102 has a function of widening an emission angle of emitted light emitted from the optical semiconductor element 10, and is fixed to the protruding portions 50 by an adhesive, for example. The optical semiconductor device 100 is a light-projecting source of a distance measuring apparatus, for example, and has a use of irradiating uniform light with a certain spread toward a target to be measured. In the optical semiconductor device 100, the light diffusion plate 102 is aligned by the protruding portions 50. Specifically, for example, the protruding portions 50 are butted against concave portions or the like provided in the light diffusion plate 102, so that a positional relationship between the optical semiconductor element 10 and the light diffusion plate 102 is automatically set. Further, at this time, an interval between the optical semiconductor element 10 and the light diffusion plate 102 is also automatically set, so that it is also possible to lower a height of the optical semiconductor device 100. In other words, in the optical semiconductor device 100, a distance between the optical semiconductor element 10 and the light diffusion plate 102 may be adjusted with accuracy. Note that, the light diffusion plate 102 is an example of the "optical member".

Figure 7B:
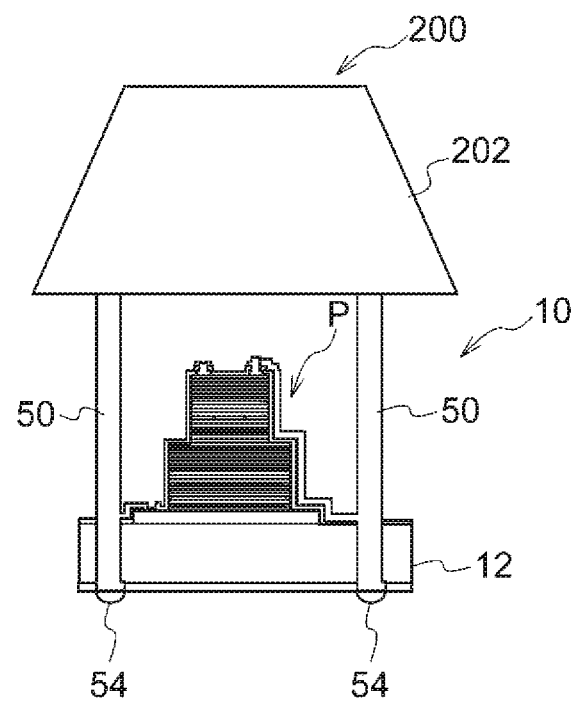
FIG. 7B is a sectional view showing an example of a configuration of an optical transmission system according to a third exemplary embodiment.

As shown in FIG. 7B, an optical transmission system 200 of the present exemplary embodiment includes the optical semiconductor element 10 and an optical fiber 202. The optical fiber 202 is fixed to the protruding portions 50 in a similar method to the light diffusion plate 102 and is aligned in a similar method. Specifically, since a relative positional relationship between an optic axis of the emitted light of the optical semiconductor element 10 and a core of the optical fiber 202 is automatically set, the coupling efficiency between the optical semiconductor element 10 and the optical fiber 202 is improved. In other words, in the optical transmission system 200, it is possible to adjust the coupling efficiency between the optical semiconductor element 10 and the optical fiber 202. Here, the optical fiber 202 is an example of the "optical member" of the present exemplary embodiment.

Note that, although the aspects of the light-emitting element have been exemplified in the exemplary embodiments, the present exemplary embodiment is not limited thereto. For example, the present exemplary embodiment may also be applied to a light-receiving element. In this case, the light-receiving element is also manufactured according to the manufacturing method described in FIGS. 2A to 2H and FIGS. 3A to 3G.

In each of the exemplary embodiments, the electrically conductive member 58 is connected to the p-side electrode wiring 36 or the n-side electrode wiring 30. However, the present exemplary embodiment is not limited thereto. For example, when the electrically conductive member 58 is used as an alignment mark and the p-side electrode wiring 36 or the n-side electrode wiring is connected by a bonding wire by using, the electrically conductive member 58 and the p-side electrode wiring 36 and the n-side electrode wiring 30 may not be connected. The electrically conductive member 58 and any one of the p-side electrode wiring 36 and the n-side electrode wiring 30 may also be connected, as required.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optical semiconductor element comprising:
   a semiconductor substrate that is semi-insulating;
   a columnar body that is formed on a front surface-side of the semiconductor substrate and configured to emit or receive light from the front surface-side;
   a front surface-side electrode that is connected to the columnar body;
   a back surface-side electrode formed on a back surface-side of the semiconductor substrate; and
   an electrically conductive member that is formed to penetrate through the semiconductor substrate to connect the front surface-side electrode and the back surface-side electrode, and has a protruding portion protruding, with respect to the front surface-side electrode, on the front surface-side of the semiconductor substrate,
   wherein the electrically conductive member is arranged separately from the columnar body,
   wherein the protruding portion has a height exceeding an upper surface of the columnar body, and
   wherein a top surface of the protruding portion is positioned higher than the upper surface of the columnar body and is separated from the upper surface of the columnar body.

2. The optical semiconductor element according to claim 1, wherein
   the protruding portion has a height exceeding the front surface-side electrode.

3. The optical semiconductor element according to claim 1, wherein
the electrically conductive member and the front surface-side electrode are connected to each other on a surface of the semiconductor substrate on which the columnar body is formed.

4. The optical semiconductor element according to claim 2, wherein
the electrically conductive member and the front surface-side electrode are connected to each other on a surface of the semiconductor substrate on which the columnar body is formed.

5. The optical semiconductor element according to claim 1, further comprising
a bump formed on the back surface-side electrode.

6. The optical semiconductor element according to claim 1, wherein
the front surface-side electrode includes an electrode having a closed shape in planar view, and the protruding portion is connected to at least a part of the electrode having the closed shape in planar view.

7. An optical semiconductor device comprising:
the optical semiconductor element according to claim 1; and
an optical member that is optically coupled to the optical semiconductor element, wherein
a positional relationship between the optical member and the columnar body is defined by the protruding portion.

8. The optical semiconductor device according to claim 7, wherein
the optical semiconductor element is a light-emitting element, and
wherein the optical member is a light diffusion member configured to diffuse light emitted from the optical semiconductor element toward an outside.

9. An optical transmission system comprising:
the optical semiconductor device according to claim 7; and
a light transmission path, as the optical member configured to transmit light emitted from the optical semiconductor element or light received at the optical semiconductor element.

* * * * *